US009519743B1

(12) United States Patent
Gaspard et al.

(10) Patent No.: US 9,519,743 B1
(45) Date of Patent: Dec. 13, 2016

(54) OPTIMAL STACKED TRANSISTOR PLACEMENT TO INCREASE SINGLE EVENT TRANSIENT ROBUSTNESS

(71) Applicant: Altera Corporation, San Jose, CA (US)

(72) Inventors: Nelson Joseph Gaspard, San Jose, CA (US); Yanzhong Xu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 297 days.

(21) Appl. No.: 14/169,840

(22) Filed: Jan. 31, 2014

(51) Int. Cl.
*G06F 17/50* (2006.01)
*H01L 27/088* (2006.01)

(52) U.S. Cl.
CPC ......... *G06F 17/5072* (2013.01); *H01L 27/088* (2013.01)

(58) Field of Classification Search
CPC .............. G06F 17/5045; G06F 17/5068; G06F 17/5072; G06F 17/5081
USPC ........ 716/100–101, 110, 114–115, 119, 136; 257/213, 214, 369
See application file for complete search history.

(56) References Cited

U.S. PATENT DOCUMENTS

| 8,191,021 | B2 | 5/2012 | Rezgui | |
| 2004/0268284 | A1* | 12/2004 | Perez | G06F 17/5068 716/119 |
| 2006/0015786 | A1* | 1/2006 | Mitra | G01R 31/318536 714/724 |
| 2006/0119410 | A1 | 6/2006 | Carlson | |
| 2006/0187700 | A1 | 8/2006 | Ho | |
| 2007/0033559 | A1* | 2/2007 | Fulkerson | G06F 17/5068 716/115 |
| 2007/0069305 | A1* | 3/2007 | Kuboyama | H03K 19/00338 257/369 |
| 2008/0235639 | A1* | 9/2008 | Awad | G05F 1/561 716/136 |
| 2008/0281572 | A1 | 11/2008 | Puri et al. | |

OTHER PUBLICATIONS

Ahlbin, et. Al., "Single-Event Transient Pulse Quenching in Advanced CMOS Logic Circuits," IEEE Transaction on Nuclear Science, vol. 56, No. 6, pp. 3050,3056, Dec. 2009.

\* cited by examiner

*Primary Examiner* — Paul Dinh

(57) ABSTRACT

Circuitry may include a substrate with an input and an output circuit coupled in series at an intermediate node. The output circuit may have an output transistor and a stack transistor coupled in series between an output node and a voltage supply terminal. The two circuits may be placed on the substrate such that a single event transient charge injected into a sensitive diffusion of the intermediate node is shared through the substrate with the sensitive diffusion of the stack transistor of the output circuit. The charge sharing may reduce the recovery time at the output node and help to reduce the recovery time at the intermediate node, thereby providing increased single event transient robustness and reducing the probability of a permanent flip of the intermediate node and the output node of the circuitry.

21 Claims, 11 Drawing Sheets

OPTIMAL STACKED TRANSISTOR PLACEMENT TO INCREASE SINGLE EVENT TRANSIENT ROBUSTNESS

BACKGROUND

This invention relates to the layout of integrated circuits, and more particularly, to optimal stacked transistor placement in the layout of integrated circuits such that the integrated circuits demonstrate increased robustness when struck by a single event charge.

Integrated circuits are subject to a phenomenon known as single event upset (SEU). A single event upset is a change of state caused by ions or electro-magnetic radiation. Cosmic rays or radioactive impurities embedded in integrated circuits and their packages may be responsible for generating such ions or electro-magnetic radiation.

When ions or electro-magnetic radiation strike the silicon substrate on which the integrated circuit is implemented, electron-hole pairs are generated. The electron-hole pairs create a conduction path that can cause a charged node for example at the input of an inverter circuit to discharge. Thus, a single event upset may cause a logic "1" at the input of the inverter circuit to change to a logic "0". The change in state from a logic "1" to a logic "0" at the input of the inverter circuit causes the output of the inverter circuit to change from a logic "0" to a logic "1". The propagation of such a single event through a circuit is sometimes referred to as a single event transient.

Upset events in sequential elements (e.g., memory elements, latches, or registers) or upset events that reach sequential elements as transients when those sequential elements store data can have serious repercussions for system performance. In certain system applications such as remote installations of telecommunications equipment, it is extremely burdensome to repair faulty equipment. Unless an integrated circuit demonstrates good immunity to single event upsets and single event transients, they will be unsuitable for these types of applications.

It would therefore be desirable to be able to improve the single event transient robustness of an integrated circuit.

SUMMARY

In accordance with certain aspects of the invention, circuitry may include a substrate and first and second circuits. The first circuit may have an input node, an output node, and first and second stacked transistors. The second circuit may have an output node that is coupled to the input node of the first circuit. The first and second circuits may be placed on the substrate such that a single event transient charge injected at the output node of the second circuit is shared with the second stacked transistor through the substrate.

It is appreciated that the present invention can be implemented in numerous ways, such as a process, an apparatus, a system, a device, or instructions executed on a programmable processor. Several inventive embodiments are described below.

In certain embodiments, the above-mentioned first stacked transistor may have one of a pair of source-drain terminals coupled to the output node of the first circuit and the other one of the pair of source-drain terminals coupled to a first diffusion of a pair of source-drain diffusions of the second stacked transistor. A second diffusion of the pair of source-drain diffusions may be coupled to a predetermined voltage supply terminal. The second circuit may have a transistor having a pair of source-drain diffusions. One of the source-drain diffusions of the transistor of the second circuit is coupled to the input node of the first circuit.

If desired, the one of the source-drain diffusions of the transistor may be placed at a first distance from the one of the pair of source-drain terminals of the first stacked transistor and at a second distance from the first diffusion, such that the second distance is shorter than the first distance. In the event that the one of the source-drain diffusions of the transistor of the second circuit is struck by a single event charge, the diffusion may share the single event charge with the first diffusion which may reduce the single event transient response.

Further features of the invention, its nature and various advantages, will be more apparent from the accompanying drawings and the following detailed description of the preferred embodiments.

DETAILED DESCRIPTION

The present invention relates to the layout of integrated circuits, and more particularly, to optimal stacked transistor placement in the layout of integrated circuits such that the integrated circuits demonstrate increased robustness when struck by a single event charge.

As described above, integrated circuits are subject to a phenomenon known as single event upset (SEU), which may cause a state to change from logic "1" to logic "0". The change in state from logic "1" to logic "0" at the input of an inverter circuit may cause the output of the inverter circuit to change state from logic "0" to logic "1". The propagation of such a single event through a circuit is sometimes referred to as a single event transient.

Inverter circuits are ubiquitous on many integrated circuits. For example, inverter circuits are used in logic AND gates, logic OR gates, and volatile memory elements, to name a few. Logic AND or logic OR gates may be implemented by combining a logic NAND or logic NOR gate with an inverter respectively. A volatile memory element may be implemented by a pair of cross-coupled inverters (latches). Some of these inverters may be implemented with stacked transistors that are coupled to voltage supply rails.

It may therefore be desirable to improve the single event transient robustness of inverter circuits, and thereby improve the single event robustness of integrated circuits.

It will be recognized by one skilled in the art, that the present exemplary embodiments may be practiced without some or all of these specific details. In other instances, well-known operations have not been described in detail in order not to unnecessarily obscure the present embodiments.

Figure 1:
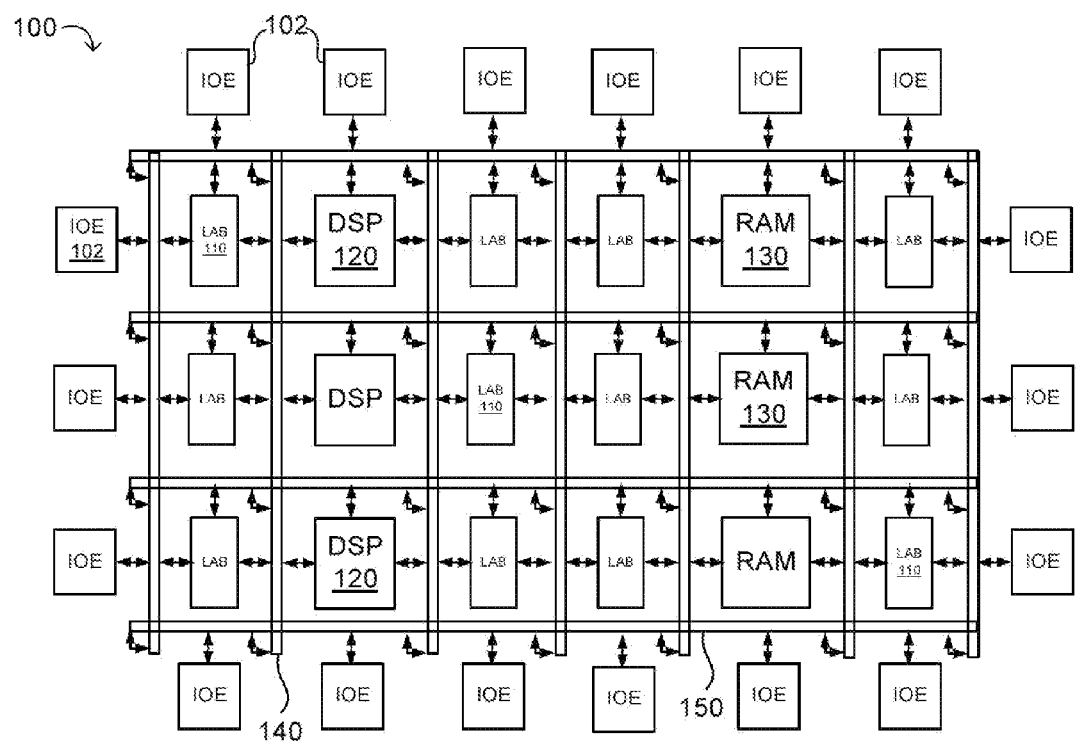
FIG. 1 is a diagram of an illustrative integrated circuit with improved stacked transistor placement to increase single event transient robustness in accordance with an embodiment.

An illustrative embodiment of an integrated circuit such as a programmable logic device (PLD) 100 with optimal stacked transistor placement to increase single event transient robustness in accordance with an embodiment is shown in FIG. 1. Programmable logic device 100 may have input/output circuitry 102 for driving signals off of PLD 100 and for receiving signals from other devices. Input/output circuitry 102 include conventional input/output circuitry, serial data transceiver circuitry, differential receiver and transmitter circuitry, or other circuitry used to connect one integrated circuit to another integrated circuit.

As shown, input/output circuitry 102 may be located around the periphery of the chip. If desired, the programmable logic device may have input/output circuitry 102 arranged in different ways. For example, input/output circuitry 102 may form one or more columns of input/output circuitry that may be located anywhere on the programmable logic device (e.g., distributed evenly across the width of the PLD). If desired, input/output circuitry 102 may form one or more rows of input/output elements (e.g., distributed across the height of the PLD). Alternatively, input/output circuitry 102 may form islands of input/output elements that may be distributed over the surface of the PLD or clustered in selected regions.

Vertical interconnection resources 140 and horizontal interconnection resources 150 such as global and local vertical and horizontal conductive lines and buses may be used to route signals on PLD 100. Vertical and horizontal interconnection resources 140 and 150 include conductive lines and programmable connections between respective conductive lines and are therefore sometimes referred to as programmable interconnects.

Programmable logic regions may include programmable components such as digital signal processing circuitry 120, storage circuitry 130, or other combinational and sequential logic circuitry organized in logic array blocks 110. The programmable logic regions may be configured to perform a custom logic function. If desired, the programmable logic region may include digital signal processing circuitry 120 and storage circuitry 130 which both may be organized in specialized blocks that have limited configurability. The programmable logic region may include additional specialized blocks such as programmable phase-locked loop circuitry, programmable delay-locked loop circuitry, or other specialized blocks with limited configurability.

Programmable logic device 100 contains programmable memory elements. These memory elements can be loaded with configuration data (sometimes also referred to as programming data) using input/output circuitry 102. Once loaded, the memory elements each provide a corresponding static control signal that controls the operation of an associated logic component in a programmable logic region. In a typical scenario, the outputs of the loaded memory elements are applied to the gates of transistors in the programmable logic region to turn certain transistors on or off and thereby configure the logic and the routing paths in the programmable logic region. Programmable logic circuit elements that may be controlled in this way include parts of multiplexers (e.g., multiplexers used for forming routing paths in programmable interconnects), look-up tables, logic arrays, AND, OR, NAND, and NOR logic gates, pass gates, inverters etc.

Memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements are loaded with configuration data during programming, memory elements are sometimes referred to as configuration memory, configuration RAM, or programmable memory elements.

The circuitry of programmable logic device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs). Each adaptive logic module may include a pair of adders, a pair of associated registers and a look-up table or other block of shared combinational logic (i.e., resources from a pair of LEs—sometimes referred to as adaptive logic elements or ALEs in this context). The larger regions may be, for example, logic array blocks (LABs) containing multiple logic elements or multiple ALMs.

During device programming, configuration data is loaded into programmable logic device 100 that configures the programmable logic regions so that their logic resources perform desired logic functions.

Programmable logic device 100 may include programmable logic regions, portions of programmable logic regions, smaller logic regions, or portions of smaller logic regions such as look-up tables or programmable multiplexer circuitry, or logic gates such as AND, OR, or inverters that are coupled to voltage supply rails through stacked transistors, whereby coupling refers to a direct or indirect connection.

Voltage supply is sometimes also referred to as supply voltage or power supply. Rails are sometimes also referred to as terminals, ports, inputs, or pins. Positive voltage supply (e.g., Vdd) may be distinguished from ground voltage supply or negative voltage supply (e.g., Vss). The diffusion of the pair of source-drain diffusion or source-drain diffusion region of a transistor that is directly connected to a voltage supply is sometimes also referred to as a non-sensitive diffusion or a non-sensitive diffusion region. In contrast, the diffusion of the pair of source-drain diffusion of a transistor that is directly connected only to a gate or a diffusion of another transistor, but not to a voltage supply is sometimes also referred to as a sensitive diffusion or a sensitive diffusion region.

Figure 2A:
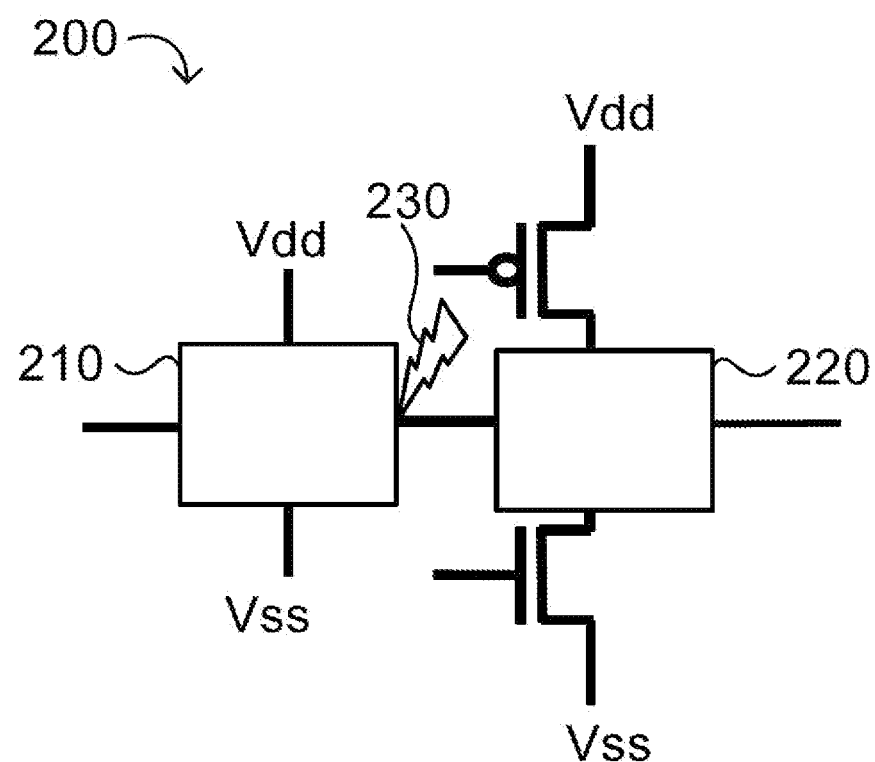
FIG. 2A is a diagram of an illustrative single event charge striking a circuit that is coupled to another circuit that is coupled to voltage supply rails through stacked transistors in accordance with an embodiment.

A circuit 220 that is coupled to voltage supply rails through stacked transistors is shown in FIG. 2A. Circuit 220 may be coupled to a positive voltage supply Vdd through a stacked PMOS transistor and to a ground voltage supply Vss through a stacked NMOS transistor. As an example, the stacked transistors may form a current leakage reduction arrangement. Circuit 220 may be coupled to an additional circuit 210. A single event deposited charge 230 at the output of circuit 210 may propagate through circuit 220, thereby producing a single event transient.

Figure 2B:
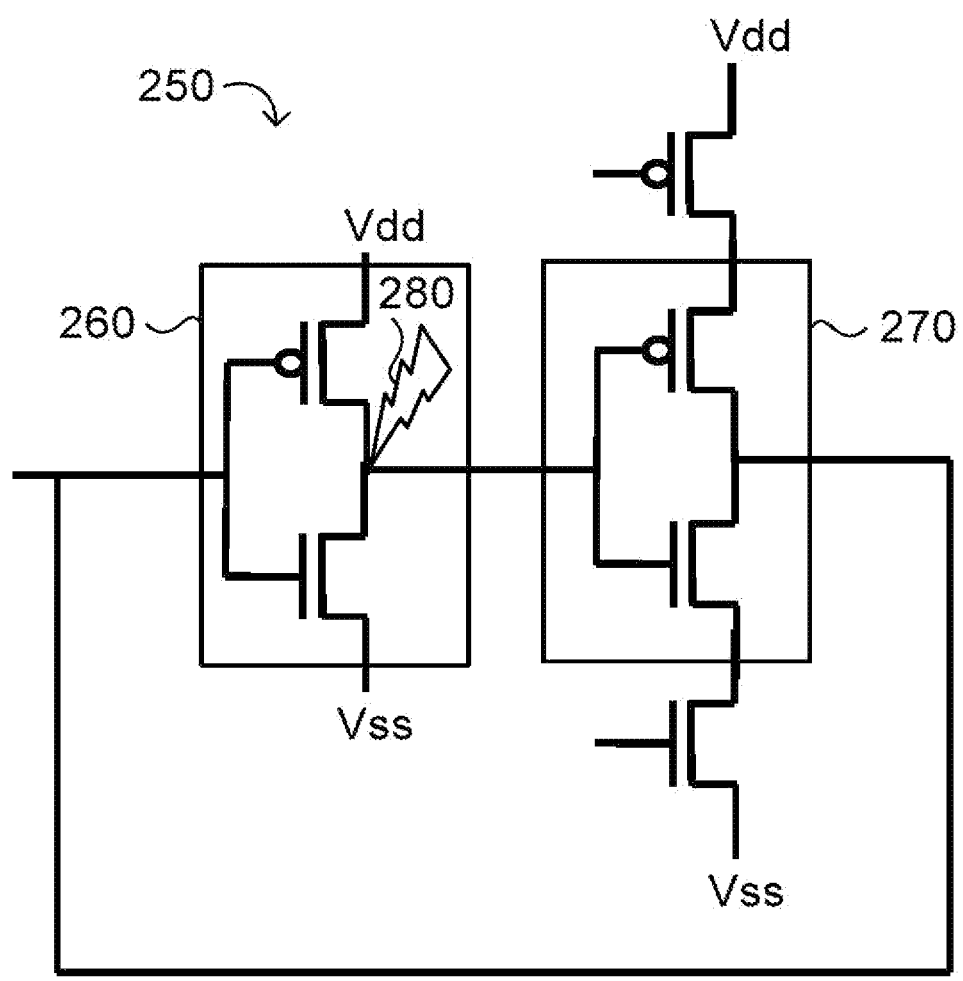
FIG. 2B is a diagram of an illustrative dual-inverter storage cell with one of the inverters struck by a single event charge in accordance with an embodiment.

FIG. 2B shows two cross-coupled inverters 260 and 270 which form a bi-stable cell 250 (e.g., used in a memory element to store a bit). Inverter 260 may be coupled to a positive voltage supply Vdd and a ground voltage supply Vss. Inverter 270 may be coupled to the positive voltage supply through a stacked PMOS transistor and to the ground voltage supply Vss through a stacked NMOS transistor. A single event strike 280 at the output of inverter 260 may flip the bit at the output of inverter 260, which may then propagate through inverter 270 and flip the bit at the output of inverter 270 depending on the gate voltages applied at the gates of the stacked transistors.

Consider, as an example, the scenario in which the output of inverter 260 is logic "1" and the output of inverter 270 is logic "0". Consider further that the drain diffusion of the NMOS transistor in inverter 260 is struck by a single event charge 280. The single event charge may cause the generation of electron-hole pairs (i.e., carriers) in the substrate of the NMOS transistor. The electron-hole pairs may create a conduction path that discharges the output of inverter circuit 260, which thereby transitions from logic "1" to logic "0".

A logic "0" at the input of inverter 270 may turn the NMOS transistor of inverter 270 off (i.e., no current may flow through the NMOS transistor) and turn the PMOS transistor of inverter 270 on (i.e., a current may flow through the PMOS transistor). In the event that the stacked PMOS transistor is also turned on, a current may flow from positive voltage supply Vdd through the stacked PMOS transistor and the PMOS transistor of inverter 270 and thereby change the output of inverter 270 from logic "0" to logic "1". Thus, single event charge 280 may cause a single event upset in bi-stable cell 250 and permanently switch the state of inverters 260 and 270 until the next write operation.

Figure 2C:
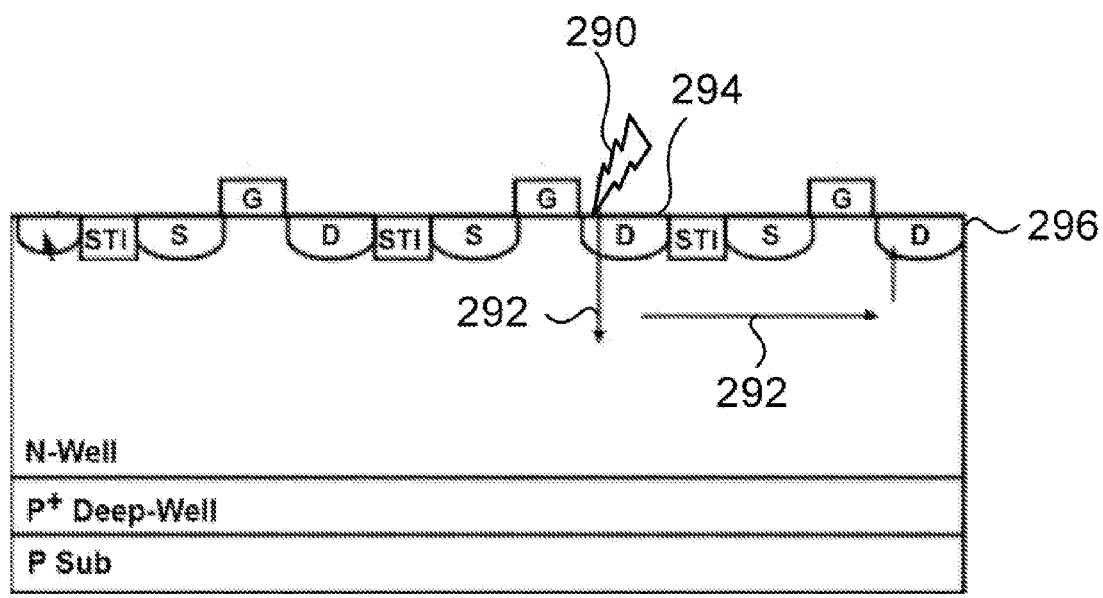
FIG. 2C is a diagram of an illustrative substrate with transistors placed next to each other to reduce the effect of a single event charge striking one of the transistors in accordance with an embodiment.

FIG. 2C shows an example of the effect that a single event deposited charge (e.g., caused by an ion strike) may have on a PMOS transistor on a substrate. The transistor may have two adjacent PMOS transistors that are separated from the affected PMOS transistor by shallow trench isolation (STI). As shown, an ion 290 may strike the drain diffusion of PMOS transistor 294 on the substrate and deposit a charge. The charge may diffuse inside the substrate along path 292 to the drain diffusion D of an adjacent PMOS transistor 296 where the charge is collected.

As an example, consider the scenario in which three inverters (e.g., three instances of inverter 260 of FIG. 2B) are arranged in series and in which the three PMOS transistors of the inverters are arranged on a substrate as shown in FIG. 2C. Consider further that PMOS transistor 294 belongs to the second inverter which is coupled between the first and third inverters and that the state of the output of the second inverter is logic "0". Thus, drain diffusion D of PMOS transistor 294 is coupled to the input of the third inverter and thereby is a sensitive diffusion.

An ion 290 that strikes the drain diffusion D of PMOS transistor 294 may deposit a charge and inject a pulse during which the output of the second inverter switches to logic for a short period of time. The change in state at the output of the second inverter causes the state of the output of the third inverter to change to logic "0". After the charge at the second inverter has dissipated, the output of the second inverter switches back to logic "0" which causes the state of the output of the third inverter to change back to logic "1".

The charge deposited at the drain diffusion of PMOS transistor 294 may diffuse inside the substrate along path 292 to the drain diffusion of the PMOS transistor 296 of the third inverter which may collect the charge and create a correcting transient pulse which may reduce the duration of the single event transient (i.e., the duration during which the output of the third inverter remains at logic "0"). Thus, placing the drain diffusions of transistors on the input and output of inverters close to each other may reduce the duration of single event transients.

Figure 3A:
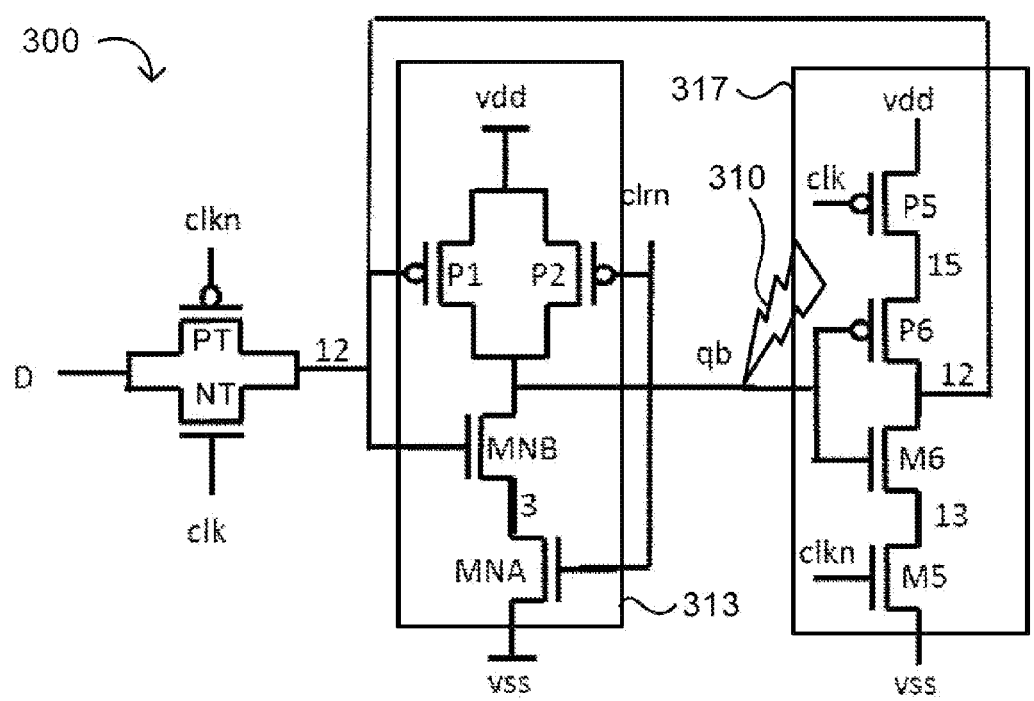
FIG. 3A is a diagram of an illustrative latch circuit with stacked transistors that can be placed to reduce the effect of a single event charge striking one of the transistors in accordance with an embodiment.
Figure 3B:
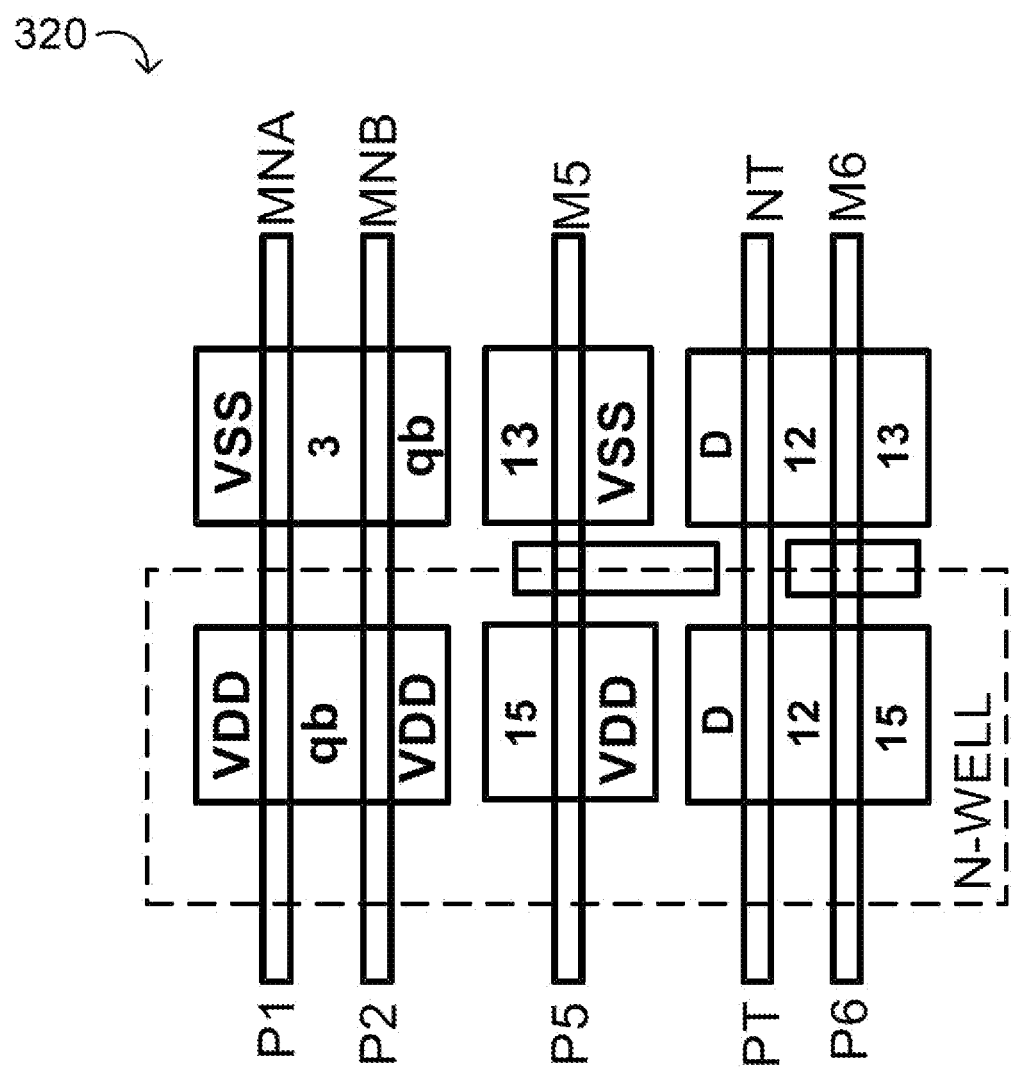
FIG. 3B is a diagram of an illustrative layout of the latch from FIG. 3A with the sensitive diffusion region of the stacked NMOS transistor placed next to the output of the first inverter in accordance with an embodiment.

FIG. 3A shows an embodiment of a latch circuit 300. Latch circuit 300 may receive data signal D, clock signal clk, inverted clock signal clkn, and inverted asynchronous clear signal clrn, and produce a signal at node 12 (i.e., at the latch output). Transistors PT and NT are turned on when the clock signal clk is logic "1" and turned off when the clock signal clk is logic "0". Transistors P5 and M5 are on when the clock signal clk is logic "0" and off when the clock signal clk is logic "1". Transistor P2 is on and transistor MNA off when the inverted asynchronous clear signal clrn is logic "0". Transistor P2 is off and transistor MNA on when the inverted asynchronous clear signal clrn is logic "1".

As shown, latch circuit 300 outputs data signal D when clock signal clk is logic "1" and inverted clock signal clkn is logic "0" because both pass transistors PT and NT are enabled. Latch circuit 300 stores the data signal D when the clock signal clk becomes logic "0" and the inverted clock signal clkn logic "1". A latch circuit which outputs the data signal whenever the enable signal (e.g., the clock signal clk) is logic "1" and which stores the data signal whenever the enable signal is logic "0" is sometimes also referred to as a transparent high latch.

The assertion of the asynchronous clear (i.e., inverted asynchronous clear signal clrn is logic "0") may turn PMOS transistor P2 on and NMOS transistor MNA off. Thus, current may flow from voltage supply vdd to node qb, which is the output of the first stage 313 and the input of the second stage 317, and node qb may be set to logic "1". When the clock signal clk is logic "0" and the input to the second stage 317 is logic "1", PMOS transistor P5 and NMOS transistors M6 and M5 are on and PMOS transistor P6 is off. Thus, the assertion of the asynchronous clear sets the latch output (i.e., node 12) to logic "0".

Consider, as an example, the scenario in which the clock signal clk is logic "0", the output of the first stage 313 (i.e., node qb) is logic "1" and the latch output (i.e., node 12) is logic "0". Consider further that a single event charge 310 strikes the drain diffusion of the NMOS transistor in inverter MNB that is coupled to node qb (i.e., the output of the first stage 313). The single event charge may cause the generation of electron-hole pairs (i.e., carriers) in the substrate of the NMOS transistor. The electron-hole pairs may create a conduction path that discharges the output of the first stage 313, which thereby transitions from logic "1" to logic "0".

A state of logic "0" at the input of the second stage 317 may turn NMOS transistor M6 off and turn PMOS transistor P6 on. Since the clock signal clk is logic "0" and thus the inverted clock signal clkn logic "1", the stacked PMOS transistor P5 and the stacked NMOS transistor M5 are also turned on and a current may flow from positive voltage supply Vdd through the stacked PMOS transistor P5 and the PMOS transistor P6 and thereby change the latch output from logic "0" to logic "1".

FIGS. 3B, 3C, 3D, and 3E show embodiments of layouts that implement latch 300 of FIG. 3A. The PMOS transistors are placed inside the N-WELL and the NMOS transistors outside the N-WELL. Cuts in the polysilicon on the border of the N-WELL (e.g., between NMOS transistors M6 and MNA and PMOS transistors P6 and P1, respectively) isolate the respective PMOS gate from the NMOS gate. The transistor names from FIG. 3A are labeled at the gate connections of each transistor. Each gate separates a pair of source/drain diffusions of a transistor. For example in FIG. 3B, the source diffusion of NMOS transistor MNA is coupled to negative voltage supply Vss, while the drain diffusion is coupled to node 3, and the source diffusion of NMOS transistor MNB is coupled to node 3, while the drain diffusion is coupled to node qb. Similarly, the source diffusions of PMOS transistors P1 and P2 are coupled to positive voltage supply Vdd, while the drain diffusions are coupled to node qb.

Transistors that are separated by shallow trench isolation (STI) are shown in separate rectangles in the layout. For example in FIG. 3B, NMOS transistors MNB and M5 as well as M5 and NT are separated by shallow trench isolation (STI), while MNA and MNB as well as NT and M6 are not separated by STI. Similarly, PMOS transistors P2 and P5 as well as P5 and PT are separated by STI, while P1 and P2 as well as PT and P6 are not separated by STI.

Consider the example above in which a single event charge (e.g., charge 310 of FIG. 3A) strikes the drain diffusion of NMOS transistor MNB that is coupled to node qb. In the example of the layout shown in FIG. 3B, the charge deposited at the drain diffusion of NMOS transistor MNB (i.e., the diffusion coupled to node qb) may diffuse inside the substrate to the drain diffusion of the NMOS transistor M5 which may collect the charge and create a correcting transient pulse which may reduce the duration of the single event transient (i.e., the duration during which the latch output at node 12 remains at logic "1"), thereby reducing the probability that the latch stays in the faulty state. Thus, placing the drain diffusions on the input of an inverter with stacked transistors (e.g., see FIG. 2B which shows inverter 270 with two stacked transistors) close to the drain diffusions of the stacked transistors may reduce the duration of single event transients and thereby provide single event transient robustness.

Figure 3C:
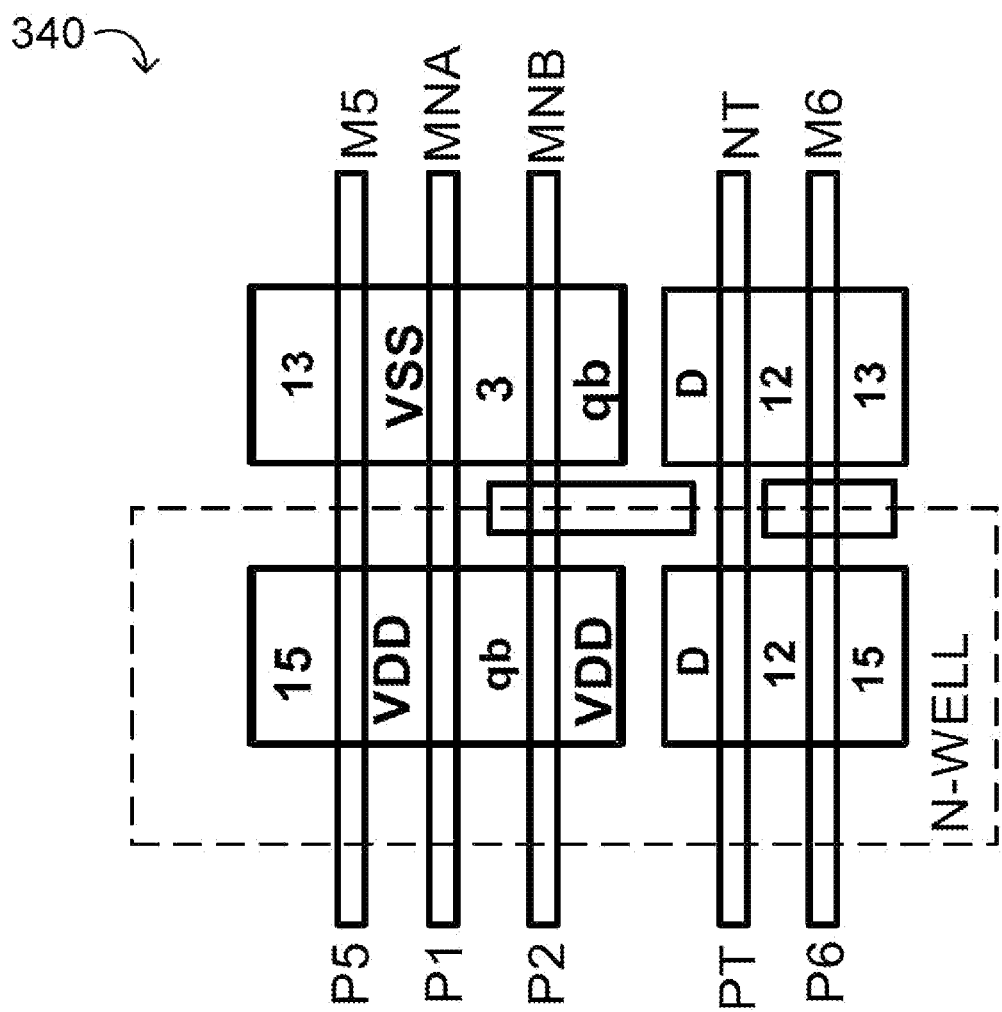
FIG. 3C is a diagram of an illustrative modified layout of the latch from FIG. 3A without shallow trench isolation between the sensitive diffusion region of the stacked transistor and the output of the first inverter in accordance with an embodiment.

FIG. 3C shows an alternative embodiment of the layout of latch 300 of FIG. 3A which may provide single event transient robustness. In this embodiment, transistors M5 and P5 are placed on the left side in contrast to FIG. 3B where M5 and P5 are placed in the middle of the layout. As shown, transistors M5 and MNA share a Vss connection while transistors P5 and P1 share a Vdd connection. The drain diffusion of transistor M5 which is coupled to node 13 and the drain diffusion of transistor MNB which is coupled to node qb are further apart compared to FIG. 3B. However, in FIG. 3C, the drain diffusions of transistors M5 and MNB may share the charge of a single event strike more efficiently because the transistors M5, MNA, and MNB are not separated by STI in FIG. 3C which is in contrast to FIG. 3B where MNB and M5 are separated by STI.

Figure 3D:
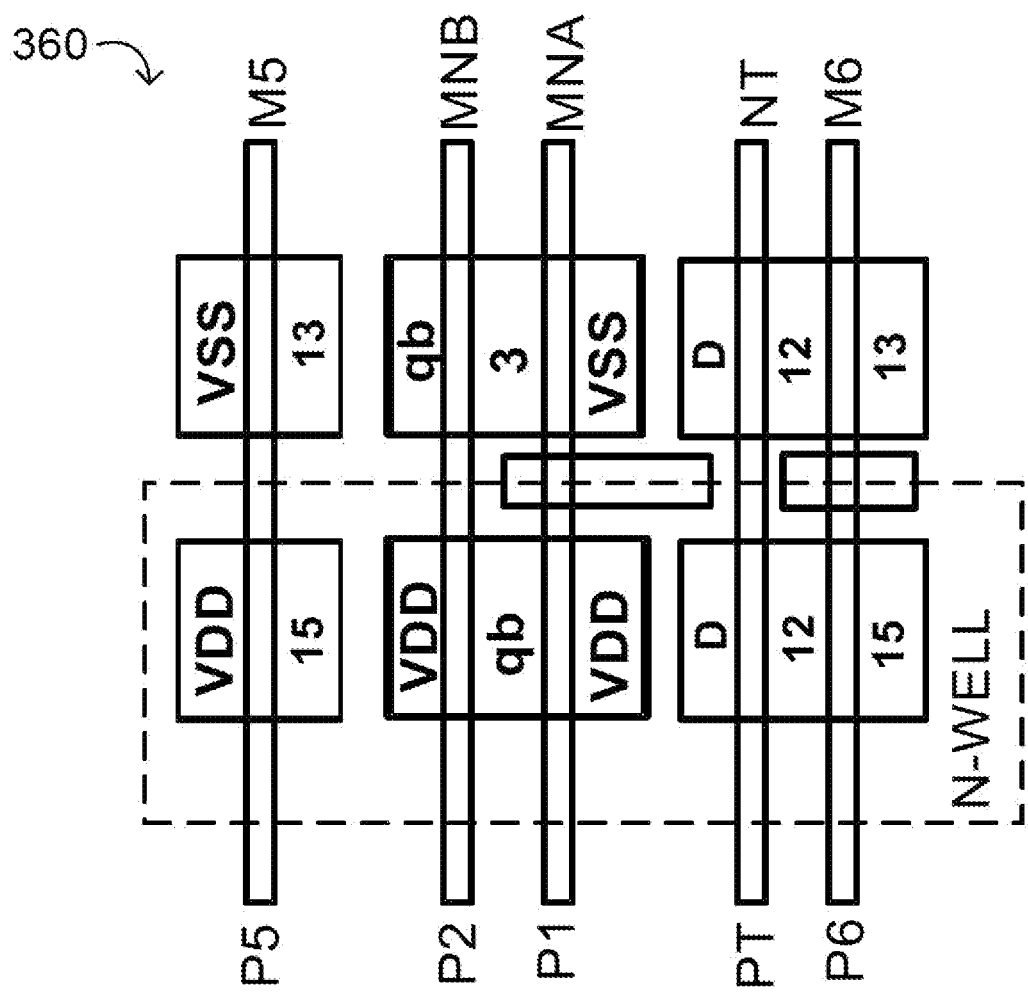
FIG. 3D is a diagram of an illustrative modified layout of the latch from FIG. 3A with non-sensitive diffusion regions placed at an edge of the substrate in accordance with an embodiment.

FIG. 3D shows another embodiment of the layout of latch 300 of FIG. 3A which may provide single event transients robustness. Compared to the layout shown in FIG. 3C, transistors MNA and MNB as well as transistors P1 and P2 have swapped positions and the voltage supply is no longer shared. Similar to the embodiment of the layout shown in FIG. 3B, the embodiment shown in FIG. 3D places the drain diffusion of transistor M5 which is coupled to node 13 next (e.g., adjacent) to the drain diffusion of transistor MNB which is coupled to node qb, thereby facilitating charge shoring between these diffusions and the creation of a correcting transient pulse in node 13 which may reduce the duration of the single event transient caused by ion strike 310 in the drain diffusion of transistor MNB.

Figure 3E:
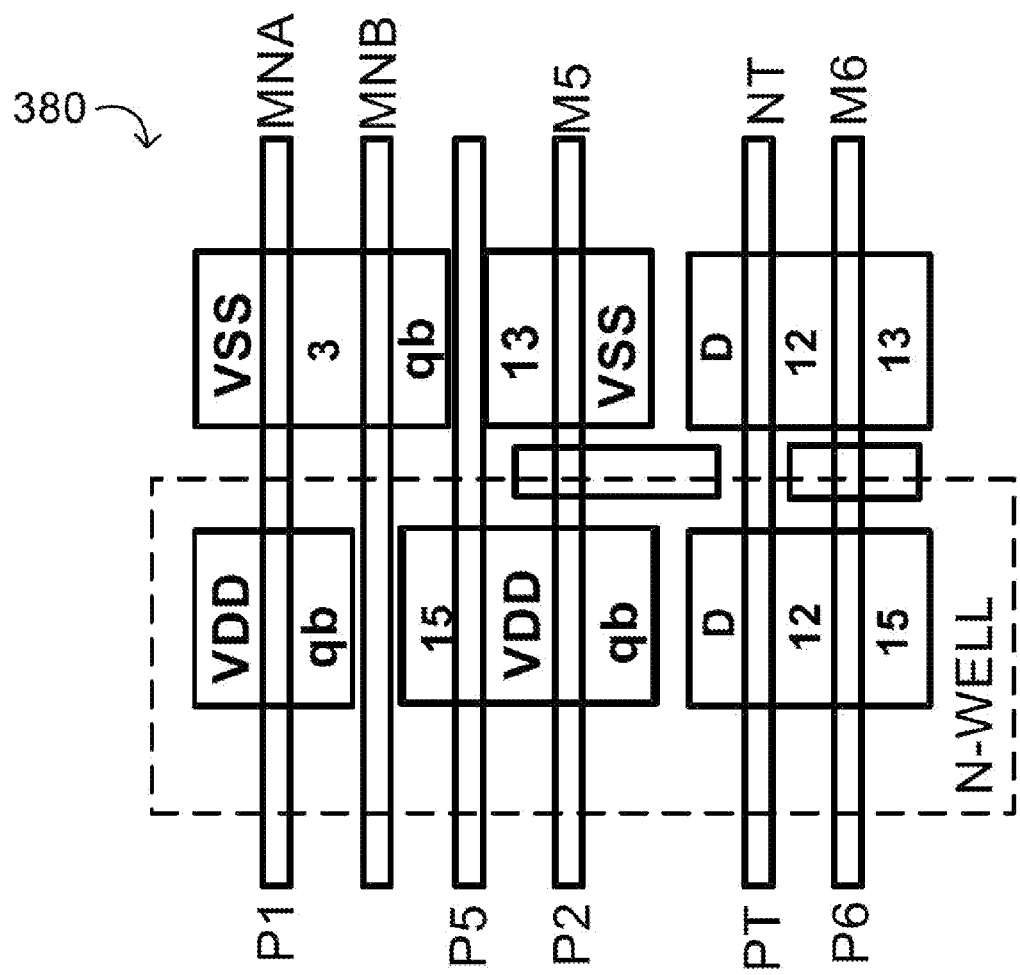
FIG. 3E is a diagram of an illustrative layout of the latch from FIG. 3A with the sensitive diffusion region of the stacked PMOS transistor placed next to the output of the first inverter in accordance with an embodiment.

FIG. 3E shows an additional embodiment of the layout of latch 300 of FIG. 3A which may provide single event transient robustness. Compared to the layout shown in FIG. 3B, the drain diffusions of PMOS transistors P1 and P5 have moved closer, thereby allowing for a charge sharing between drain diffusions of PMOS transistors P1 and P5 in addition to a charge sharing between NMOS transistors MNB and M5. Thus, a correcting transient pulse may occur in node 13 and in node 15 which may reduce the duration of the single event transient caused by ion strike 310 in the drain diffusion of transistors MNB or P1. The additional charge sharing may overcome the increased probability that an ion strikes a sensitive diffusion which is increased due to an increase in the number of sensitive diffusions caused by the separation of transistor P1 from transistor P2 in FIG. 3E compared to FIG. 3B (e.g., layout 380 of FIG. 3E has two PMOS transistors with drain diffusions coupled to node qb while layout 320 of FIG. 3B shares the drain diffusion coupled to node qb between the two PMOS transistors).

Figure 4:
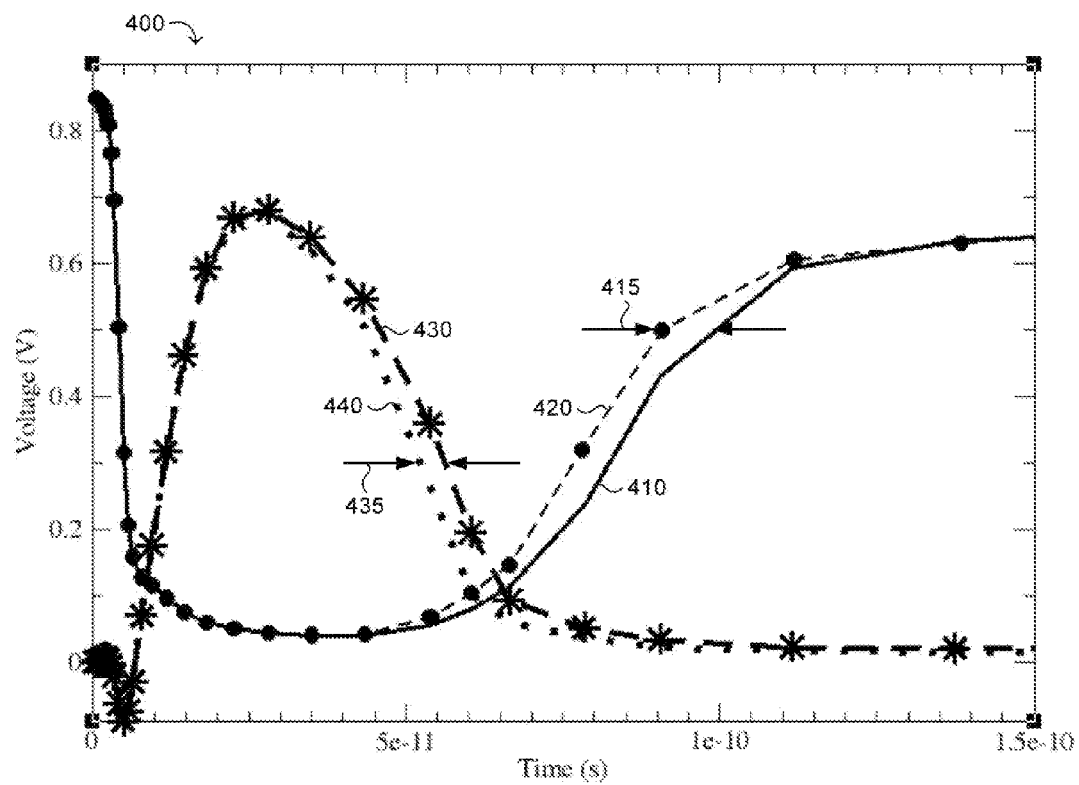
FIG. 4 is a graph of illustrative simulation results showing the response of the SEU resistant latch shown in FIG. 3B to a single event strike in accordance with an embodiment.

As shown above, the embodiments of the layout of FIGS. 3B, 3C, 3D, and 3E that implement latch 300 of FIG. 3A may provide single event transient robustness. The results of a simulated single event strike and the response by an embodiment of the latch implementation from FIG. 3A is shown in FIG. 4. Lines 410 and 420 illustrate the voltage at node qb of latch 300 (see FIG. 3A) over time and lines 430 and 440 illustrate the voltage at node 12 of latch 300. Lines 410 and 430 show the layout in which the drain diffusions qb and 13 of transistors MNB and M5 are placed closed to each other as illustrated in FIGS. 3B, 3C, 3D, and 3E, while lines 420 and 430 show the baseline case in which the diffusions of transistors MNB and M5 are placed further apart.

In the simulation of FIG. 4, at time zero, the voltage at node qb is 0.85V (e.g., node qb is in state logic "1"), the voltage at node 12 is 0V (e.g., node 12 is in state logic "0"), and a single event charge is injected in the drain diffusion of NMOS transistor MNB (see FIG. 3A). In the first 20 picoseconds, the injected charge produces a substantial voltage drop below 0.1V at node qb, as illustrated by lines 410 and 420 and perturbs the voltage at node 12 which leads to a substantial voltage increase above 0.68V as illustrated by lines 430 and 440. However, the charge sharing between drain diffusions qb and 13 produces a shorter recovery time at node 12 starting after only 30 picoseconds after the injection of the single event charge (see time gap 435 that separates line 440 from line 430). The shorter recovery time at node 12 helps to reduce the recovery time at node qb (see time gap 415 that separates line 420 from line 410), thereby providing increased single event transient robustness and reducing the probability of a permanent flip of the states of nodes qb and 12.

Figure 5:
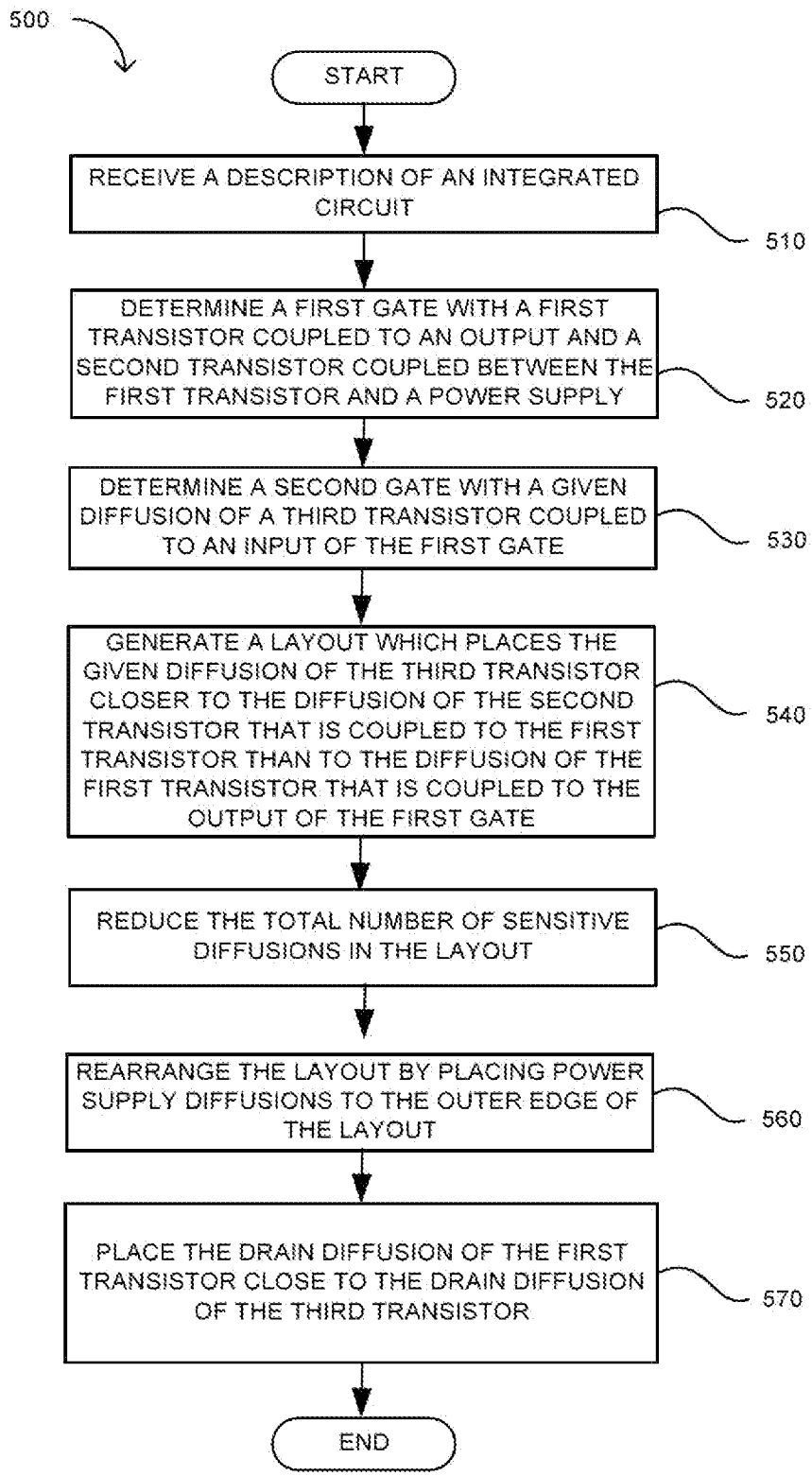
FIG. 5 is a flow chart showing illustrative steps for generating a layout that reduces the effect of a single event strike through the placement of transistors in accordance with an embodiment.

FIG. 5 shows illustrative steps that a placement tool may perform when generating a layout with increased single event transient robustness for an integrated circuit. During step 510, the placement tool may receive a description of the integrated circuit. For example, the placement tool may receive a description of latch circuit 300 of FIG. 3A. During step 520, the placement tool may determine (e.g., identify) a first gate with a first transistor coupled to an output and a second transistor coupled between the first transistor and a power supply. For example, the placement tool may identify stage 317 of FIG. 3A with transistor M6 coupled to an output and transistor M5 coupled between transistor M6 and power supply vss. During step 530, the placement tool may determine a second gate that has a given diffusion of a third transistor coupled to an input of the first gate. For example, the placement tool may identify stage 313 of FIG. 3A with diffusion qb of transistor MNB coupled to the input of stage 317.

During step 540, the placement tool may generate a layout. The layout may place the given diffusion of the third transistor closer to the diffusion of the second transistor that is coupled to the first transistor than to the diffusion of the first transistor that is coupled to the output of the first gate. Thus, the given diffusion of the third transistor and the diffusion of the second transistor that is coupled to the first transistor may share the charge of a single event strike, which may reduce the duration of a single event transient and thereby increase the robustness of the integrated circuit against a single event charge. An embodiment of such a layout is shown in FIG. 3E in which diffusion qb of transistor MNB is placed closer to diffusion 13 of transistor M6 than to diffusion 12 of transistor M5.

During step 550, the placement tool may reduce the total number of sensitive diffusions in the layout which further increase the robustness of the integrated circuit against a single event charge by reducing the total size of sensitive circuit area. For example, the 12 sensitive diffusions of the layout shown in FIG. 3E may be reduced to 11 sensitive diffusions as shown in FIG. 3C. During step 560, the placement tool may rearrange the layout by placing diffusions that are coupled to power supply rails at or near the outer edge of the layout. For example, the layout shown in FIG. 3D has diffusions that are coupled to power supply rails placed on the left edge of layout 360.

During step 570, the placement tool may place the drain diffusion of the third transistor close to the drain diffusion of the first transistor to further increase the charge sharing between the input and output of the first gate, which may further reduce the duration of a single event transient and thereby increase the robustness of the integrated circuit against a single event charge. Such an arrangement is shown in FIG. 3C where diffusion qb is placed close to diffusion 13 and 12.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using high-speed serial interface circuitry is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:
1. Circuitry, comprising:
   a substrate;
   a first circuit with an input node, an output node, and first and second stacked transistors, wherein the first stacked transistor is coupled between the output node and the second stacked transistor, and wherein the first circuit is formed in the substrate;
   a second circuit with an output node, wherein the output node of the second circuit is coupled to the input node of the first circuit, and wherein the second circuit is formed in the substrate; and
   a transistor in the second circuit having a pair of source-drain diffusions, wherein one of the source-drain diffusions of the transistor is coupled to the input node of the first circuit, wherein the transistor is placed at a first distance in the substrate from the second stacked transistor and at a second distance in the substrate from the output node of the first circuit, wherein the second distance is longer than the first distance, and wherein the first stacked transistor, the second stacked transistor, and the transistor of the second circuit are of a predetermined channel type.

2. The circuitry of claim 1, wherein the first circuit comprises an inverter.

3. The circuitry of claim 1, wherein the first stacked transistor comprises:
   a pair of source-drain terminals, wherein one of the pair of source-drain terminals is coupled to the output node of the first circuit.

4. The circuitry of claim 3, wherein the pair of source-drain terminals in the first stacked transistor comprise a first pair of source-drain terminals, and wherein the second stacked transistor comprises:
   a second pair of source-drain diffusions, wherein a first diffusion of the second pair of source-drain diffusions is coupled to the other one of the first pair of source-drain terminals of the first stacked transistor and a second diffusion of the second pair of source-drain diffusions is coupled to a predetermined voltage supply terminal.

5. The circuitry of claim 4, wherein the one of the source-drain diffusions of the transistor in the second circuit is placed at a third distance from the one of the pair of source-drain terminals of the first stacked transistor and at a fourth distance from the first diffusion of the second pair of source-drain diffusions of the second stacked transistor, wherein the fourth distance is shorter than the third distance, and wherein the first stacked transistor, the second stacked transistor, and the transistor of the second circuit are of a predetermined channel type.

6. The circuitry of claim 5, wherein the one of the source-drain diffusions of the transistor in the second circuit shares a single-event transient charge with the first diffusion of the second pair of source-drain diffusions of the second stacked transistor.

7. The circuitry of claim 5, wherein the predetermined channel type comprises n-type, and wherein the predetermined voltage supply terminal is a ground voltage supply terminal.

8. The circuitry of claim 5, wherein the predetermined channel type comprises p-type, and wherein the predetermined voltage supply terminal is a positive voltage supply terminal.

9. A method, comprising:
receiving a description of an integrated circuit;
determining in the description of the integrated circuit a first logic gate with a first output, a first transistor coupled to the first output, and a second transistor coupled between the first transistor and a voltage supply terminal;
determining in the description of the integrated circuit a second logic gate with a second output that is coupled to an input of the first logic gate and a third transistor that is coupled to the second output; and
generating a layout of the description of the integrated circuit, wherein the layout places the first, second, and third transistors on a substrate, and wherein a single-event transient charge injected at the second output is shared with the second transistor through the substrate.

10. The method of claim 9, wherein the second transistor has a pair of source-drain terminals, wherein a first terminal of the pair of source-drain terminals is coupled to the first transistor and a second terminal of the pair of source-drain terminals is coupled to the voltage supply terminal, and wherein generating a layout of the description of the integrated circuit further comprises:
placing the second output at a first distance from the first output and a second distance from the first terminal, wherein the second distance is shorter than the first distance, and wherein the first, second, and third transistors have a predetermined type.

11. The method of claim 10, further comprising:
rearranging the layout by reducing the first distance.

12. The method of claim 10, wherein the first and second logic gates have a number of sensitive diffusion regions, the method further comprising:
rearranging the layout by reducing the number of sensitive diffusion regions.

13. The method of claim 10, wherein the first and second logic gates have diffusion regions coupled to a positive voltage supply terminal, the method further comprising:
rearranging the layout by placing the diffusion regions coupled to the positive voltage supply terminal at an outer edge of the layout.

14. The method of claim 10, wherein the first and second logic gates have diffusion regions coupled to a ground voltage supply terminal, the method further comprising:
rearranging the layout by placing the diffusion regions coupled to the ground voltage supply terminal at an outer edge of the layout.

15. The method of claim 10, wherein placing the second output at a first distance from the first output and a second distance from the first terminal comprises:
determining whether the predetermined type of the first, second, and third transistors is n-type or p-type; and
in response to determining that the predetermined type of the first, second, and third transistors is n-type, placing a drain diffusion of the second transistor at the second distance from a drain diffusion of the third transistor.

16. The method of claim 10, wherein placing the second output at a first distance from the first output and a second distance from the first terminal comprises:
determining whether the predetermined type of the first, second, and third transistors is n-type or p-type; and
in response to determining that the predetermined type of the first, second, and third transistors is p-type, placing a source diffusion of the second transistor at the second distance from a source diffusion of the third transistor.

17. Non-transitory computer-readable storage media for generating a layout of a circuit description, the non-transitory computer-readable storage media comprising instructions for:
determining in the circuit description first and second gates, wherein the first gate has an output, a first transistor coupled to the output, and a second transistor coupled between the first transistor and a voltage supply terminal, and wherein the second gate has an output that is coupled to an input of the first gate;
determining whether the output of the second gate can be placed closer to the output of the first gate than to the second transistor in the layout of the circuit description; and
in response to determining that the output of the second gate cannot be placed closer to the output of the first gate than to the second transistor in the layout of the circuit description, generating a layout of the circuit description, in which the output of the second gate is placed closer to the second transistor than to the output of the first gate to reduce a single event transient duration.

18. The non-transitory computer-readable media of claim 17, wherein the second transistor has first and second terminals, wherein the first terminal is coupled to the first transistor and the second terminal is coupled to the voltage supply terminal, and wherein generating the layout of the circuit description comprises:
placing the output of the second gate closer to the first terminal than to the output of the first gate.

19. The non-transitory computer-readable media of claim 17, further comprising instructions for:
iteratively modifying the generated layout of the circuit description.

20. The non-transitory computer-readable media of claim 18, wherein iteratively modifying the generated layout of the circuit description comprises:
reducing a number of sensitive diffusion regions by rearranging the generated layout of the circuit description.

21. The non-transitory computer-readable media of claim 18, wherein iteratively modifying the generated layout of the circuit description comprises:

rearranging the generated layout by placing a number of non-sensitive diffusion regions on the periphery of the layout.

* * * * *